United States Patent [19]
So

[11] Patent Number: 5,877,528
[45] Date of Patent: Mar. 2, 1999

[54] STRUCTURE TO PROVIDE EFFECTIVE CHANNEL-STOP IN TERMINATION AREAS FOR TRENCHED POWER TRANSISTORS

[75] Inventor: Koon Chong So, San Jose, Calif.

[73] Assignee: MegaMOS Corporation, San Jose, Calif.

[21] Appl. No.: 810,546

[22] Filed: Mar. 3, 1997

[51] Int. Cl.⁶ ............................ H01L 29/76; H01L 29/94; H01L 31/062
[52] U.S. Cl. ........................... 257/341; 257/331; 257/337
[58] Field of Search ..................................... 257/329, 330, 257/331, 334, 341, 372, 376, 345, 396, 397, 398, 399, 400

[56] References Cited

U.S. PATENT DOCUMENTS 5,614,751  3/1997  Yilmaz et al. ............................ 257/394

*Primary Examiner*—Wael Fahmy
*Attorney, Agent, or Firm*—Bo-In Lin

[57] ABSTRACT

The present invention discloses a trenched DMOS device supported on a substrate of a first conductivity type including a core cell area which includes at least a trenched DMOS cell having a gate disposed in a trench and a drain region disposed in the substrate, the substrate further includes a termination area which includes at least a channel-stop trench. The trenched DMOS cell includes a source region of the first conductivity type extending from the top surface of the substrate adjacent to the trenches in the substrate. The trenched DMOS cell further includes a body region of a second conductivity type of opposite polarity from the first conductivity type, the body region extends from the top surface surrounding the source region adjacent the trenches in the substrate. The trenched DMOS device further includes an insulating layer lining the trenches and a conductive material filling the trenches. The channel stop trench in the termination area with the conductive material filled therein is in electrical contact with the drain region via a metal contact formed thereon wherein the channel stop trench filled with the conductive material is surrounded by and insulated from the substrate by the insulating layer lining the channel stop trench whereby a channel stop is formed therein.

9 Claims, 10 Drawing Sheets

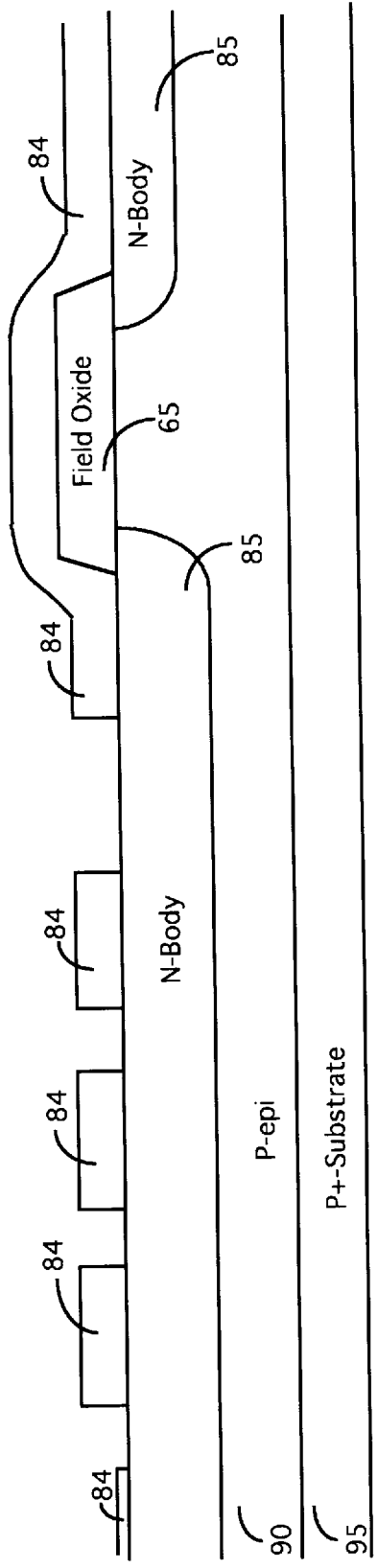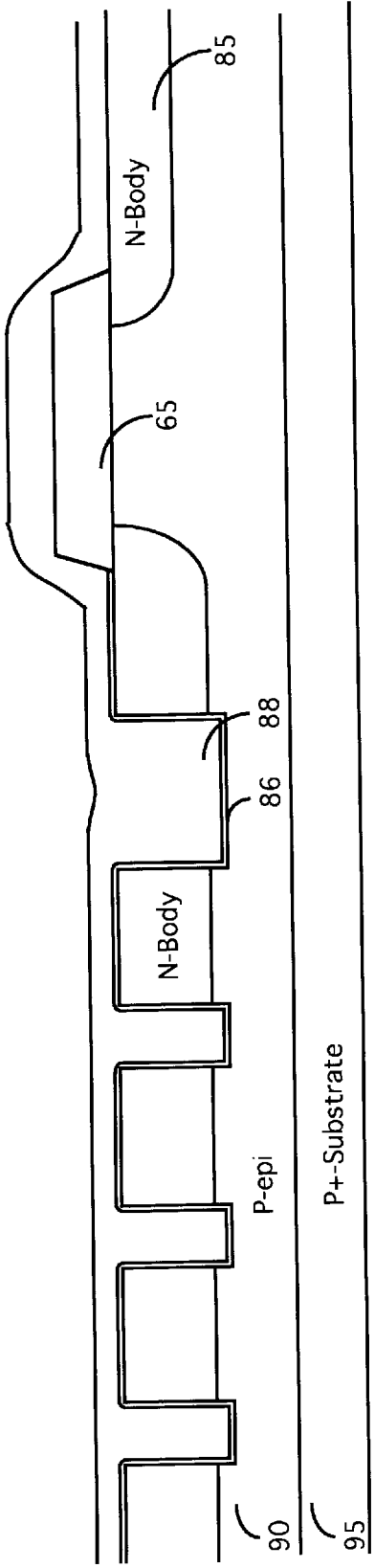
FIG. 2A (Prior Art)
FIG. 2B (Prior Art)

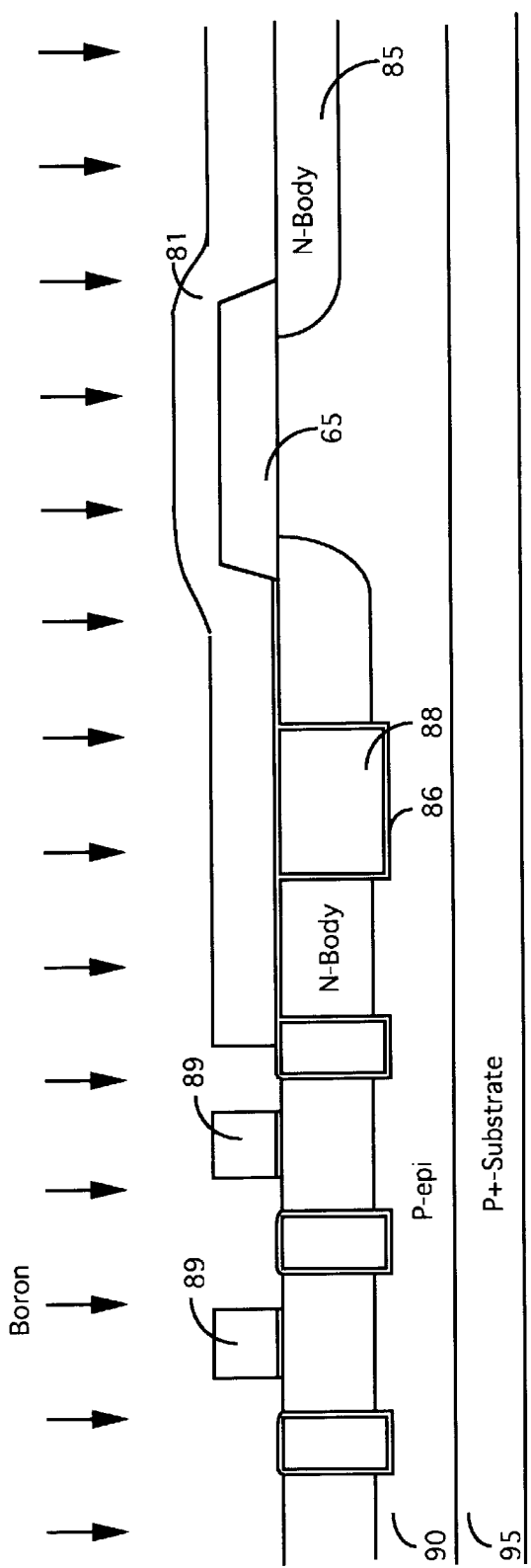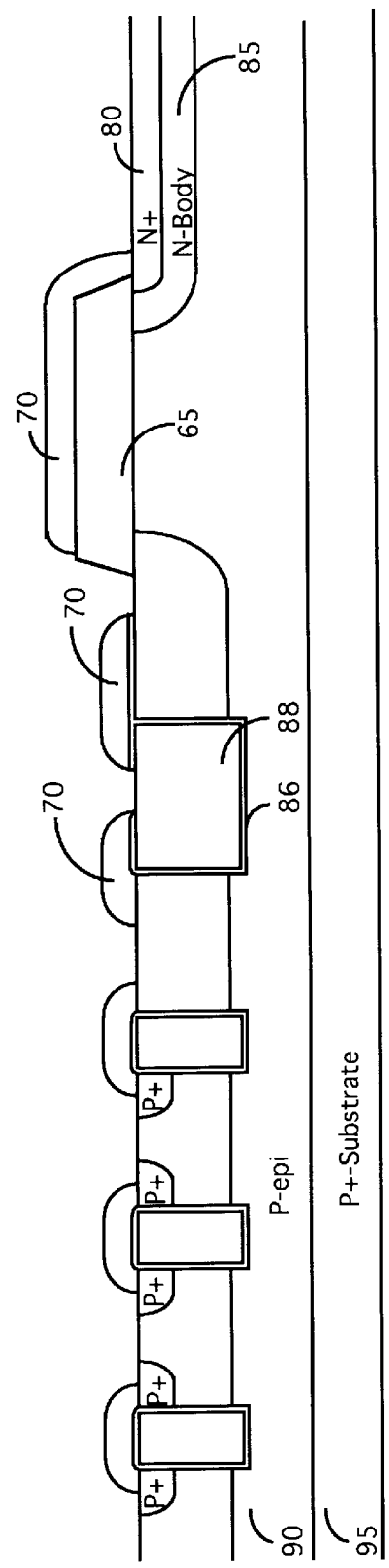

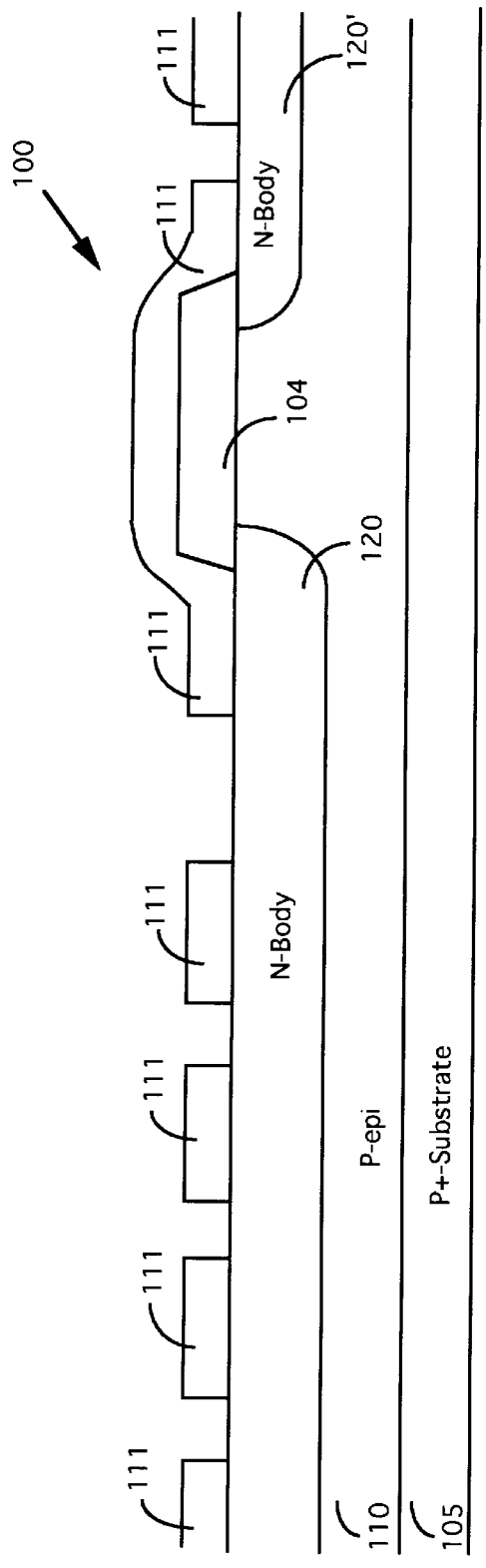
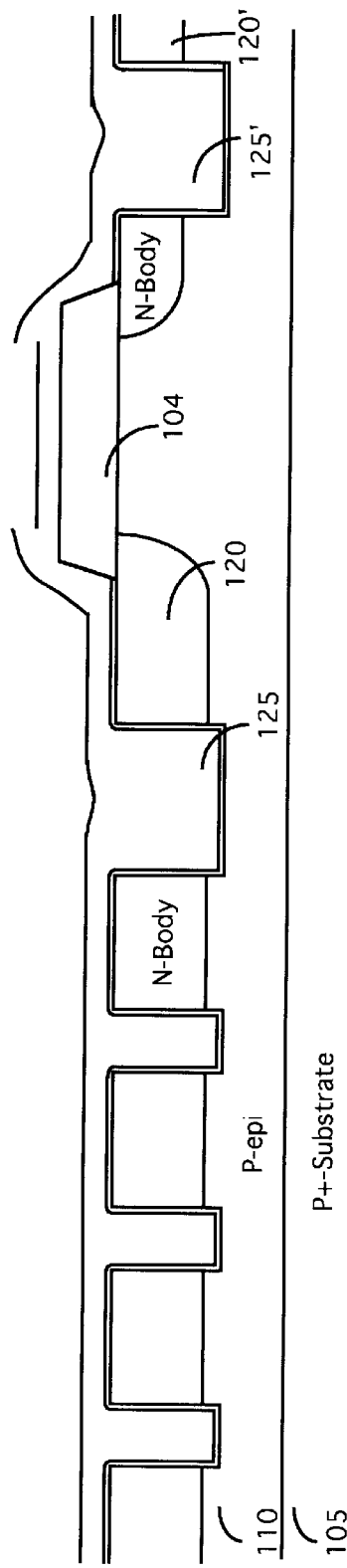

STRUCTURE TO PROVIDE EFFECTIVE CHANNEL-STOP IN TERMINATION AREAS FOR TRENCHED POWER TRANSISTORS

BACKGROUND OF THE INVENTION

1. Field of the Invention

This invention relates generally to the structure and fabrication process of trenched DMOS power transistors. More particularly, this invention relates to a novel and improved structure and process for fabricating a trenched DMOS power transistors provided with specially trenched channel stop structure in the termination areas to prevent leakage current by terminating a depletion current channel with a drain voltage applied over a thin oxide layer lining the specially configured trenched channel stops.

2. Description of the Prior Art

Leakage currents in the termination areas caused by an ineffective channel stop is still a technical difficulty faced by the designers and manufacturers of the trench semiconductor power devices. This difficulty is due to the special structural features in the termination areas of the trenched double-diffusion metal oxide semiconductor (DMOS) transistors. The structure differences in termination areas between the planar and trenched DMOS lead to the channel stop which is typically implemented and function properly in a planar transistor, to fail in carrying out the channel stop functions for a trenched double-diffusion metal oxide semiconductor (DMOS) device. As a result of this ineffective channel stop for the trenched transistors in the termination areas, leakage currents are often experienced which leads to degradation in device performances. In order to terminate this leakage current, some devices are manufactured with additional mask to form a specially configured channel stop in the termination area. Production costs are increased due to additional processing steps involved in applying an extra mask in a trenched semiconductor power device for the purpose for stopping the leak current.

In order to better understand the technical background of the present invention, the channel stops typically implemented for a planar device is first described. FIG. 1A is a cross-sectional view of a p-channel planar DMOS transistor 10 near the termination area. The DMOS transistor 10 is supported on a P+ substrate 15 and an P− epi-taxial layer 20 formed on its top. The transistor 10 includes a n-body region 25 with a heavily doped n+ body contact region 30 in electrical contact with a body contact 40. The transistor 10 further has a field oxide 35 defining the termination area where a channel stop 45 is formed. In order to properly configure the channel stop 45 in the termination area outside of the field oxide 35, before the termination n-body region 25' and the source region 28 are insulated by a PSG or BPSG protection layer 38, a channel stop poly 44 is formed with a thin oxide layer 50 underneath. By adding a channel stop poly 44 which is electrical contact with the source 28 through the metal layer of channel stop 45. The channel stop poly 44 has a voltage equivalent to the voltage of the epi region 20 and the drain region 15 since the termination body region 25' is floating. The drain voltage in the channel stop poly 44 is applied through the thin oxide layer 50 to stop a channel, formed by the depletion layer, as that shown by the dotted lines for conducting electrical current. Thus a leakage current in the termination area is stopped by applying a drain voltage through a thin oxide layer 50 to an immediate under-layer to cut off a current flow by forming a channel stop poly layer 44 connected to the termination source region 28 while coupled to the depleted channel layer immediately underneath the thin oxide layer 50 below the poly layer 44.

FIG. 1B is a cross sectional view of a trenched DMOS transistor 60 including the core cell area and the termination area. The core cell area includes a plurality of trenched DMOS cell with the poly gate formed in the trenches. For the sake of simplicity, since these cells are standard cells, no detail description would be necessary for illustrating the technical difficulties of the channel stop for the trenched DMOS. In the termination area which is shown on the right hand side of the field oxide 65, a protective BSG or BPSG layer 70 is formed thereon. A channel stop 75 is formed with a metallic layer, e.g., an aluminum layer, overlying a body contact region 80 in a n-body region 85. As shown by the dotted lines for a current channel formed in the epi-region 90 supported by the substrate 95, the channel for current flow cannot be stopped by the channel stop 75. The channel stop has a drain voltage. However, the drain voltage in the channel stop 75 cannot be effectively applied to the underneath layer near the channel region 98 due a greater thickness of the oxide field 70. A leakage current is conducted to flow through the depleted channel region 98 to a recombination zone 99 in the edge of the termination area for charge recombination thus forming an undesirable leakage current in the termination area.

For those of ordinary skill in the art, a device structure in the termination area as that shown in the cross sectional view of FIG. 1B is most commonly implemented. This structural difference is produced by employing a manufacture process-flow which is commonly applied as will be described below illustrated with FIG. 2. Unlike a planar device, the polysilicon for the trenched transistors is now deposited into the trenches. The polysilicon layer which is formed above the trench is then removed by a planarization process including the poly layer above the trenches in the termination areas. Therefore, in contrast to a planar DMOS, the polysilicon layer with a thin oxide layer is removed for a trenched DMOS device in the area underneath the channel stop 75. The channel stop 75 is not in contact with a polysilicon layer with a thin oxide layer underneath. Instead the channel stop 75 is insulated by a field oxide layer 65 of much greater thickness. Due to this structural difference, the channel stop which generally function properly for a planar device is not effective when the poly layer with the thin oxide layer underneath are removed during a standard trenched DMOS planarization process.

A processing flow commonly employed to manufacture the trenched DMOS transistor 60 is illustrated in FIGS. 2A to 2E. As shown in FIG. 2A, the processing steps begins by first growing a P epitaxial layer on top of a P+ substrate 95. An initial oxidation process is performed to grow an oxide layer 65 and active mask is employed to remove a portion of the initial oxide layer 65 to define the active regions. A blank n-body implant is carried out with phosphorous ions to form the n-body region 85. A n-body diffusion process is then carried out at an elevated temperature to increase the depth of the n-body region 85. A photo-resist is applied as the trench mask 84.

Referring to FIG. 2B. with photoresist 84 employed as a trench mask, a trench etch process, which is a dry anisotropic etch process, is carried out to form trenches. A sacrification oxidation process is to form oxide layer which is followed by a sacrification oxide etch process. A gate oxide layer 86 is then formed by a gate oxidation process. A poly deposition process is performed to deposit a poly layer 88. Referring to FIG. 2B, a planarization etch is performed to form a planar surface by etching a top layer to 0.2–0.5 μ from the deposited poly. A P+ implantation process is carried out to dope the poly layer 88. A poly etch is carried out to dry etch the poly layer 88 till the top surface is removed with the end-point detection to terminate the etch process when the polysilicon layer above the trench is removed.

Referring to FIG. 2C, a P+ block mask 89 is applied to carry out an P+ implant to form the P+ region 91. The P+ implantation is carried out with a boron ion beam, then the resist, i.e., the P+ blocking mask 89, is stripped. Referring to FIG. 2D, the P+ source regions 91 are driven into desired junction depth by a diffusion process. A BPSG or PSG is deposited to form an insulation layer 70. A BPSG flow or BSG densification process is performed. Referring to FIG. 2D, a contact mask (not shown) is applied to perform an etch process to define the contacts windows in order to be ready for making source and gate contacts. A blank phosphorous implant is carried out to form the n+ regions 93 for providing a low-resistance body contact of the DMOS cell. A metal deposition process is carried out to form an overlaying metal layer. The final DMOS transistor is completed by applying a metal mask to pattern the source contact, the gate contact, the field plate and the channel stop (CS). By the use of this standard process flow, the channel stop 75 in the termination area is formed which is insulated by a field oxide layer 65 as that shown in FIGS. 1B and 2E. The channel stop 75 is not effective to prevent a leakage current flowing through a depletion channel layer 98.

In order to overcome this difficulty, an alternate manufacture process has to be applied as that shown in FIGS. 2F to 2I. An extra mask 82 especially configured for manufacturing DMOS device with a better channel stop 75' has to be applied. This extra mask 82 is employed to block the n-body implantation into the channel strop region. The manufacture processes illustrated in FIGS. 2F to 2I are basically self explanatory. Referring to FIG. 2I the DMOS device manufactured by the use of this extra mask 82 has an improved channel stop 75' because a p-doped region 97 is now in direct contact with the channel stop 75', The leakage current flowing through a depletion region underneath the p-doped region 97 is effectively stopped with a drain voltage applied to the channel stop 75', However, the production costs are increased and more processing steps are required when this extra channel stop mask 82 has to employed.

Therefore, there a need still exits in the art of power device fabrication, particularly for DMOS design and fabrication, to provide a structure and fabrication process that would resolve these difficulties. It is preferable that the improved DMOS device is manufactured with effective channel stop without requiring additional masks or more processing steps such that the production cost would not be increased for manufacturing this improved DMOS device.

SUMMARY OF THE PRESENT INVENTION

It is therefore an object of the present invention to provide an improved trenched DMOS structure, and fabrication process to overcome the aforementioned difficulties encountered in the prior art.

Specifically, it is an object of the present invention to provide an improved trench DMOS structure and fabrication process in the termination area wherein a channel stop is provided by forming a channel stop trench filled with polysilicon above a thin oxide layer thus providing an effective channel stop for a trenched DMOS transistor in the termination areas.

Another object of the present invention is to provide an improved trench DMOS structure and fabrication process by employing a trenched channel stop in the termination areas wherein identical manufacture processing steps are applied except a new trench mask is applied whereby an effective channel stop is provided without requiring changes of manufacture process or incurring any increase in production cost.

Briefly, this invention discloses a preferred embodiment which is DMOS transistor on a substrate with specially configured termination trench for stopping a thin depletion layer near the bottom edges of the specially configured termination trench with a thin oxide lining layer. This thin depletion layer carries a leakage current which is effectively stopped by this specially configured termination trench with a thin oxide lining layer. The method of manufacturing this transistor includes the steps of: (a) forming an epi-layer of a first conductivity type as a drain region on the substrate and then growing an initial oxide layer over the epi-layer; (b) applying an active layer for etching the initial oxide layer to define an active area; (c) performing a blank body implant with impurities of a second conductivity type followed by a body-diffusion process at an elevated temperature thus forming a body layer; (d) applying a trench mask including a specially configured termination trench for etching the a plurality of trenches in the substrate; and (e)removing the trench mask followed by carrying out steps to form a gate in each of the trenches including the specially configure termination trench and to form a plurality of source regions and then protective and contact layers thereon.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 2A to 2I are cross-sectional views for illustrating the processing steps for fabricating a trenched DMOS transistor of a prior art where the channel stop is insulated by a thick field oxide layer;

FIGS. 4A to 4E show the processing steps for manufacturing a trenched DMOS transistor according to the present invention wherein a novel channel stop in the termination area is formed with a termination trench which is lined by a thin oxide layer.

DETAILED DESCRIPTION OF THE PREFERRED EMBODIMENT

Figure 1A:
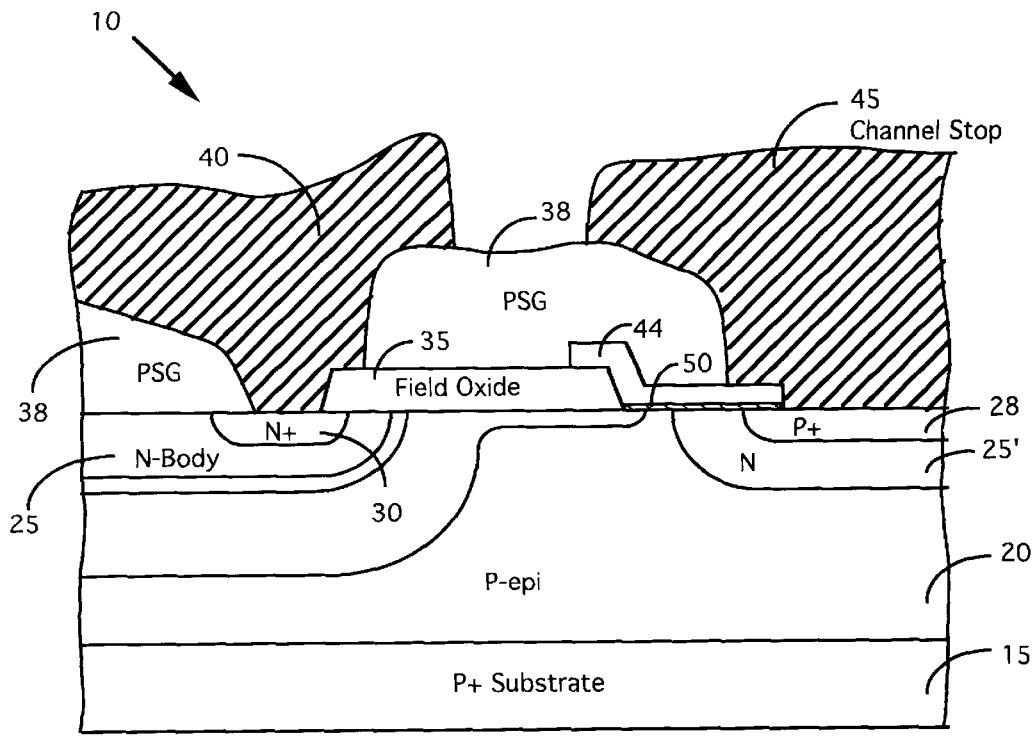
FIG. 1A is a cross-sectional view of a prior art structure of a general planar DMOS transistor with a channel stop in the termination areas.
Figure 1B:
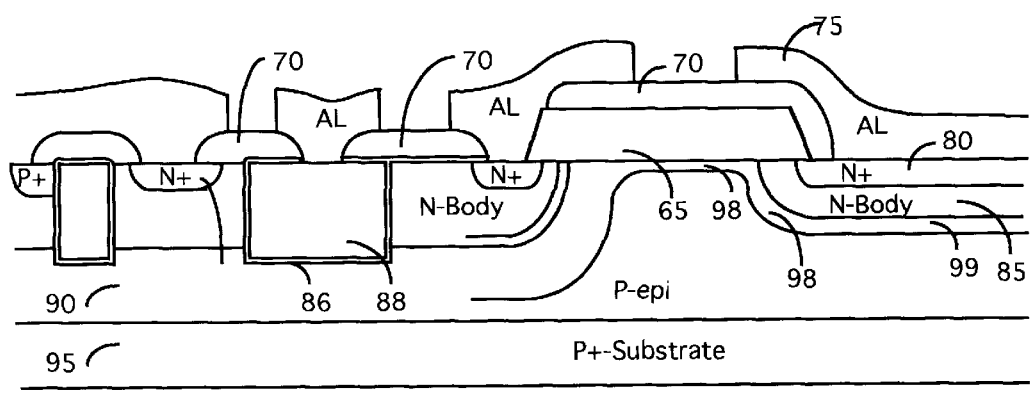
FIG. 1B is a cross-sectional view of a prior art structure of a general trenched DMOS transistor with a channel stop in the termination areas.
Figure 2E:
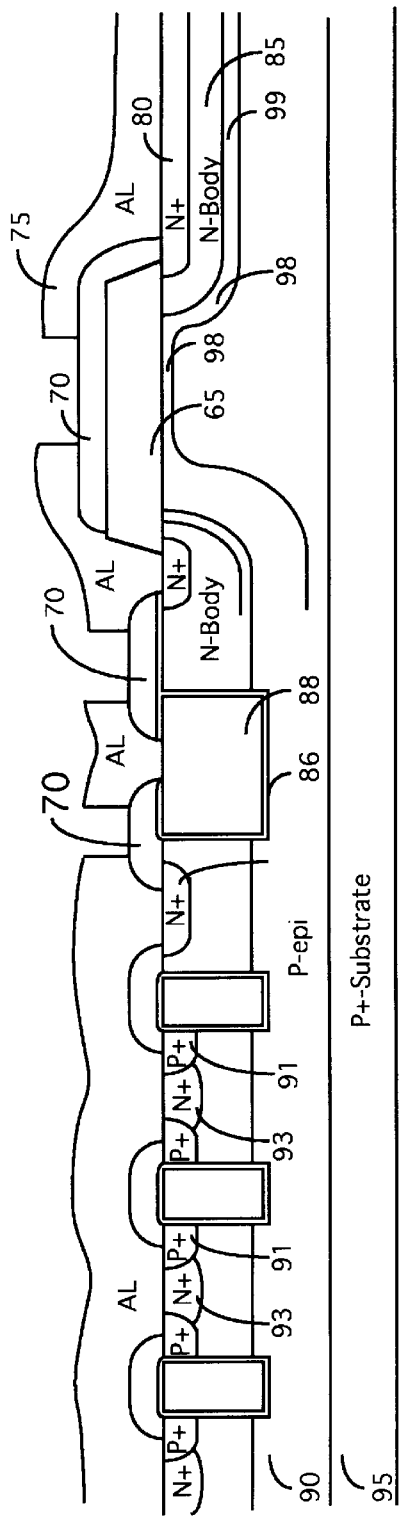
Figure 2F:
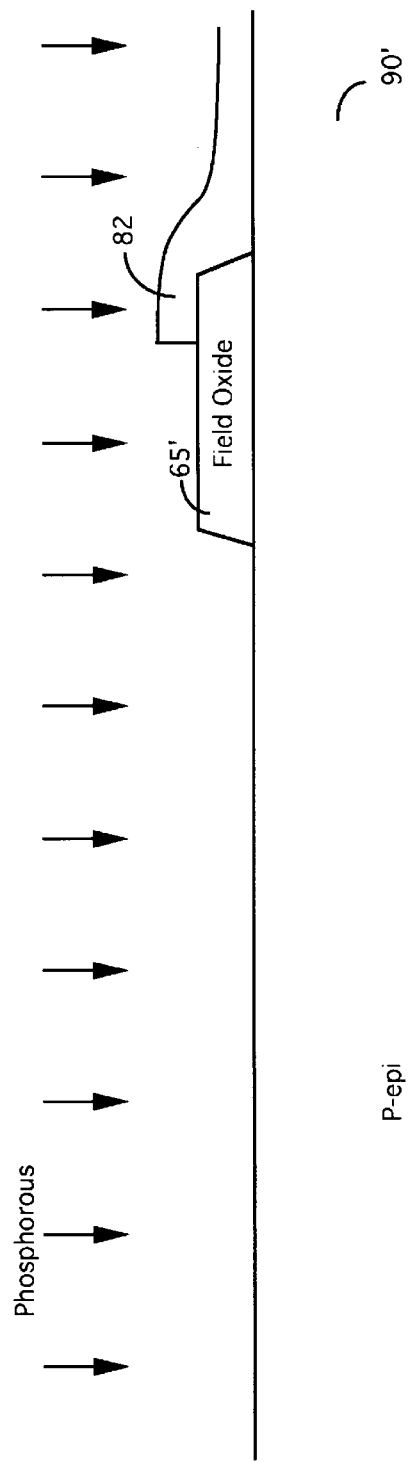
Figure 2G:
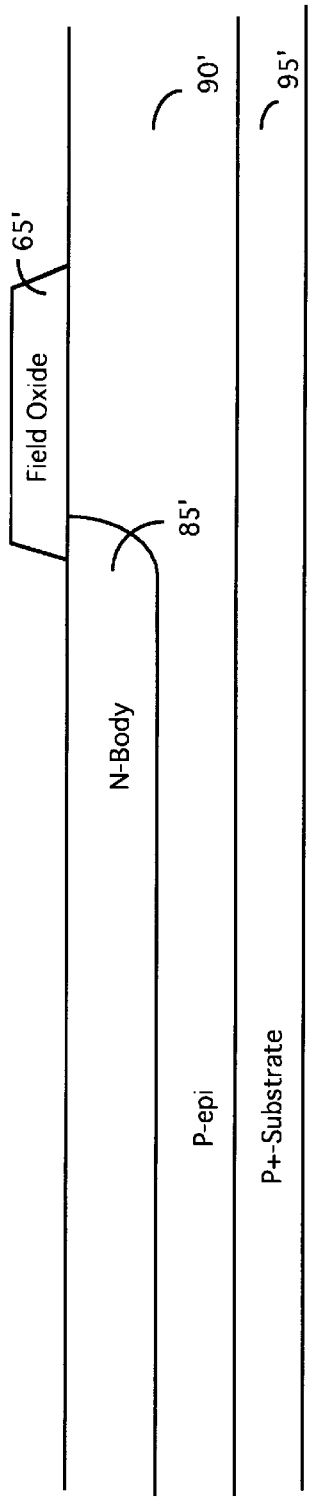
Figure 2H:
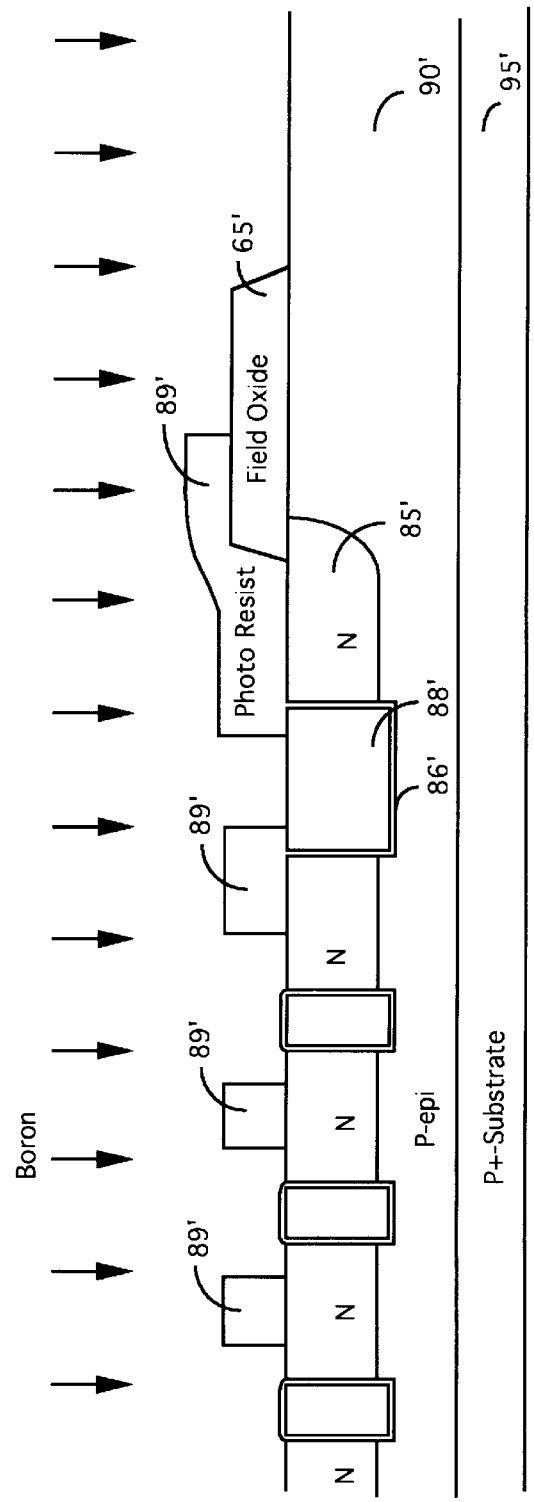
Figure 21:
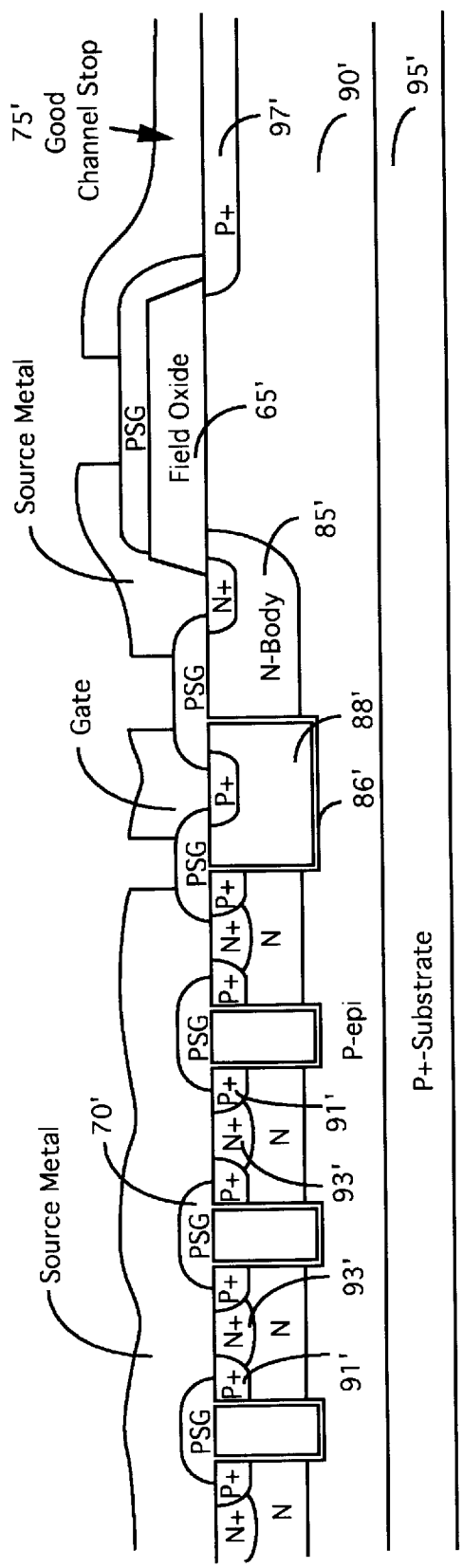
Figure 3:
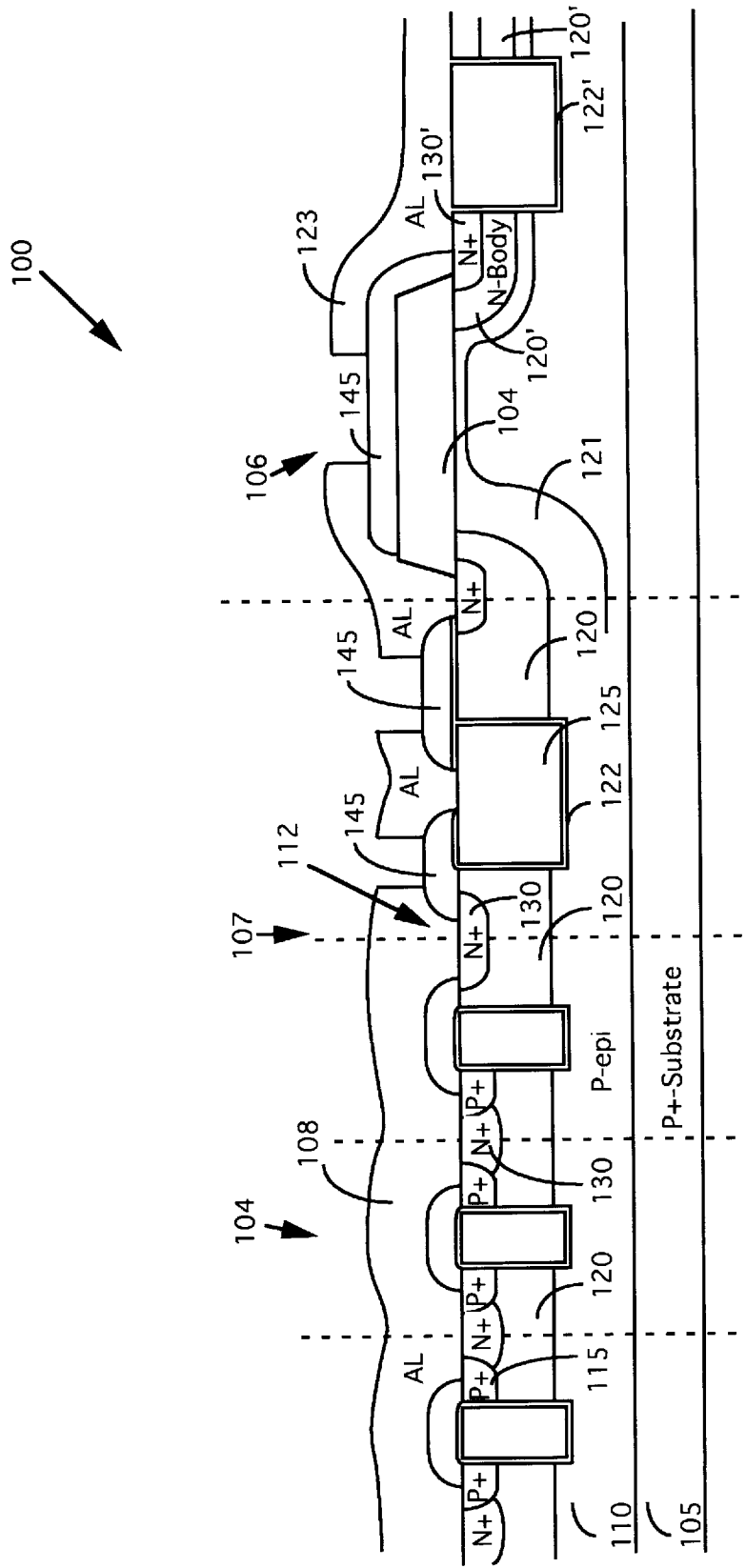
FIG. 3 is a cross sectional view of a novel trench DMOS transistor including a novel channel stop in the termination formed with a specially configured termination trench lined by a thin oxide layer.

FIG. 3 shows the cross sectional view of a preferred embodiment of the present invention wherein a DMOS transistor 100 is depicted. The DMOS transistor 100 is formed on a P+ substrate 105 supporting a N epi-layer 110 thereon. The DMOS transistor 100 includes a plurality of cells 104 in the core cell area 107 each having a deeper vertical n-body region 120 enclosing a P+ source region 115 therein. The DMOS transistor 100 further includes a trenched gate 125 formed with polysilicon layer deposited in a trench formed in the epi-layer 110 disposed in the center of the cell 104 and surrounded by the P+ source regions 115 and the n-body regions 120. The DMOS transistor 100 also includes a n+ region 130 formed between the source regions 115 to provide a body contact with a metallic layer 108.

Opposite from the core cell area 107 is a termination area 106 separated by a field oxide layer 104. In the core cell area 107, next to the field oxide layer 104, a dummy cell 112 is formed. The dummy cell 112 includes a trenched gate 125 as well as a n-body region 120 except there is no source region as those of a regular cell 104. In the termination area 106, a similar dummy cell 112' is formed which includes a trenched gate 125', a n-body 120' and a n+ body contact region 130', As shown by the dotted line, a depletion layer 121 is formed underneath the n-body region 120 and the field oxide layer 104, the depletion layer 121 extends to a region underneath the n-body region 120' in the termination area 106. The depletion layer 121 carrying a channel current is stopped in the termination area right at the point where the n-body 120' intersects the trenched gate 125', The trenched poly gate 125' in the termination area 106 has a thin lining oxide layer 122', As the n-body region 120' in the termination area 106 is floating. The n-body region 120' is in electric contact with the p– epi-layer 110 and therefore has a drain voltage. As the poly gate 125' is in electric contact with the n-body region through the metallic layer 123, the trenched poly gate 125' has a drain voltage too. The drain voltage is then applied over the thin oxide lining layer 122' on the bottom of the trenched gate 125' to terminate the depletion channel layer 121 where the trenched gate 125' intersects with the n-body region 120' Unlike the regular trenched DMOS of the prior art, the channel stop 123 can effectively terminate the depletion channel layer 121 because a thin oxide lining layer 122' is formed on the side-walls and the bottom of the trenched gates 125' in the termination area 106.

In summary, a transistor 100 is disclosed in this invention which includes a substrate 105 of a first conductivity type including a core cell area 104 which includes at least a cell having a gate disposed in a trench and a drain region disposed in the substrate 105, the substrate further includes a termination area 106 includes at least a channel-stop trench 125', The transistor 100 further includes an insulating layer 122 lining the trenches and a conductive material filling the trenches. The channel stop trench 125' in the termination area 106 with the conductive material filled therein is in electrical contact with the drain region and surrounded by and insulated from the substrate by the insulating layer 122' lining the channel stop trench 125' whereby a channel stop is formed therein.

Figure 4C:
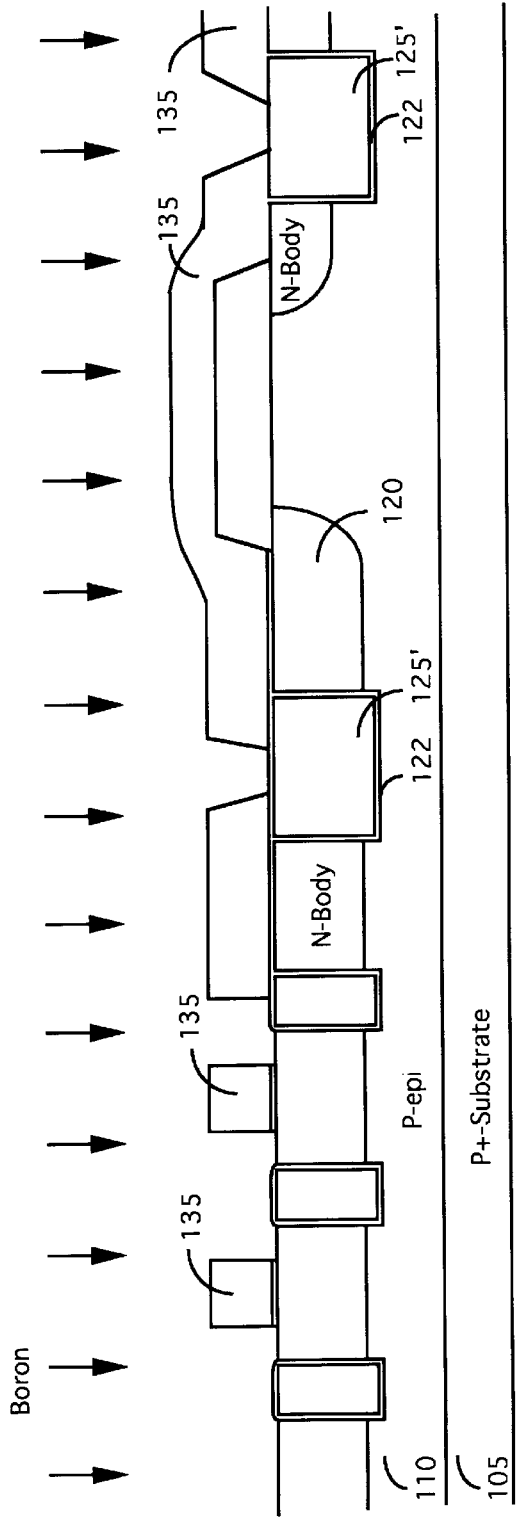

Please refer to FIGS. 4A to 4E for the processing steps for manufacturing the power MOSFET device 100 described above. As shown in FIG. 4A, the processing steps begins by first growing a P epitaxial layer 110 with a resistivity ranging from 0.1 to 5.0 ohm-cm on top of a $P^+$ substrate 105. The substrate has a resistivity of 0.01 to 0.02 ohm-cm. The thickness and the resistivity of the epitaxial layer 110 depend on the device requirements for the on-resistance and breakdown voltage. In a preferred embodiment, the thickness of the epi-layer 110 is about three to twenty microns (3–20 $\mu$m). An initial oxidation process is performed to grow an oxide layer 104 ranging from 6,000 to 10,000 Å and active mask is employed to remove the initial oxide layer 104 to define the active regions. A blank n-boy implant is carried out with phosphorous ions at 60–100 Kev with an ion beam of $2\times10^{13}$ to $2\times10^{14}$/cm$^2$ flux density to form the n-body region 120. A n-body diffusion process is then carried out at an elevated temperature of 1,000°–1,200° C. for ten minutes to three hours to increase the depth of the n-body region 120 to 1.0–2.0$\mu$. A photo-resist is applied as the trench mask 111.

Referring to FIG. 4B. with photoresist is employed as a trench mask 111, a trench etch process is performed. It is to be noted that the trench mask 111 is specially configured for the termination area 106 to formed a termination trench 125', A trench etch process, which is a dry anisotropic etch process, is applied to form trenches of 1.0 to 2.0 microns in width and 1.0 to 2.0 micron in depth. A sacrification oxidation process is applied which can be either a dry or wet oxidation process conducted at a temperature of 900°–1100° C. to form oxide layer of approximately 300–2000 Å in thickness which is followed by a scarification oxide etch process. A gate oxide layer 122 is then formed by a gate oxidation process which can be a wet or dry oxidation process carried out at a temperature of 800° to 1100° C. to form a layer of thickness in the range of 200 to 1,000 Å. A poly deposition process is performed to deposit a poly layer 125 ranging from 1.5 to 3.0$\mu$ in thickness. A planarization etch is performed to form a planar surface by etching a top layer to 0.2–0.5$\mu$ from the deposited poly. A P+ implantation is carried out to dope the poly layer 125 to have a sheet resistance of 20–40 ohm/cm$^2$. Referring to FIG. 4B, where a poly etch is carried out to dry etch the poly layer 125, including the specially configured termination trench 125', till the top surface is removed with the end-point detection to terminate the etch process when the polysilicon layer above the trench is removed.

Figure 4D:
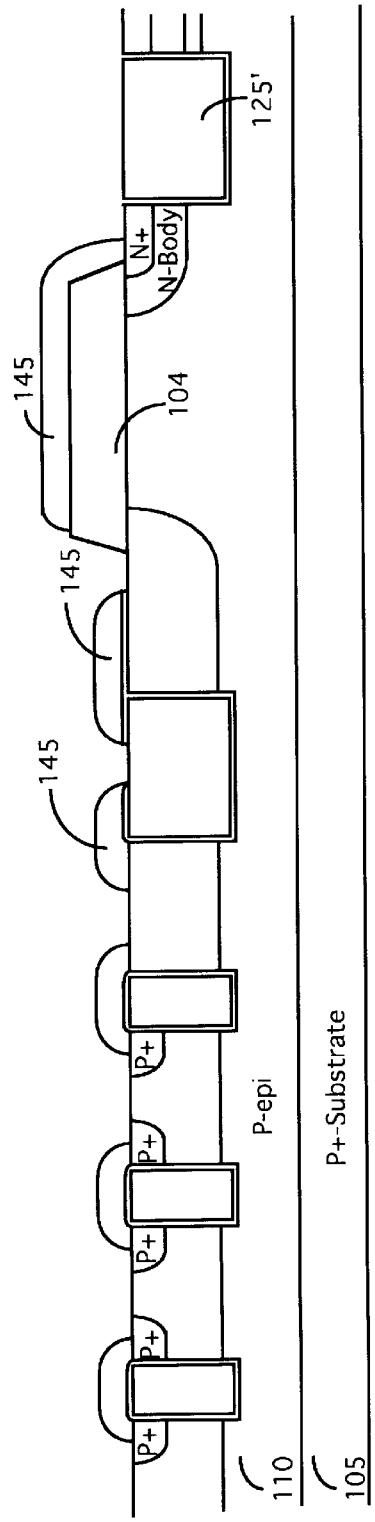
Figure 4E:
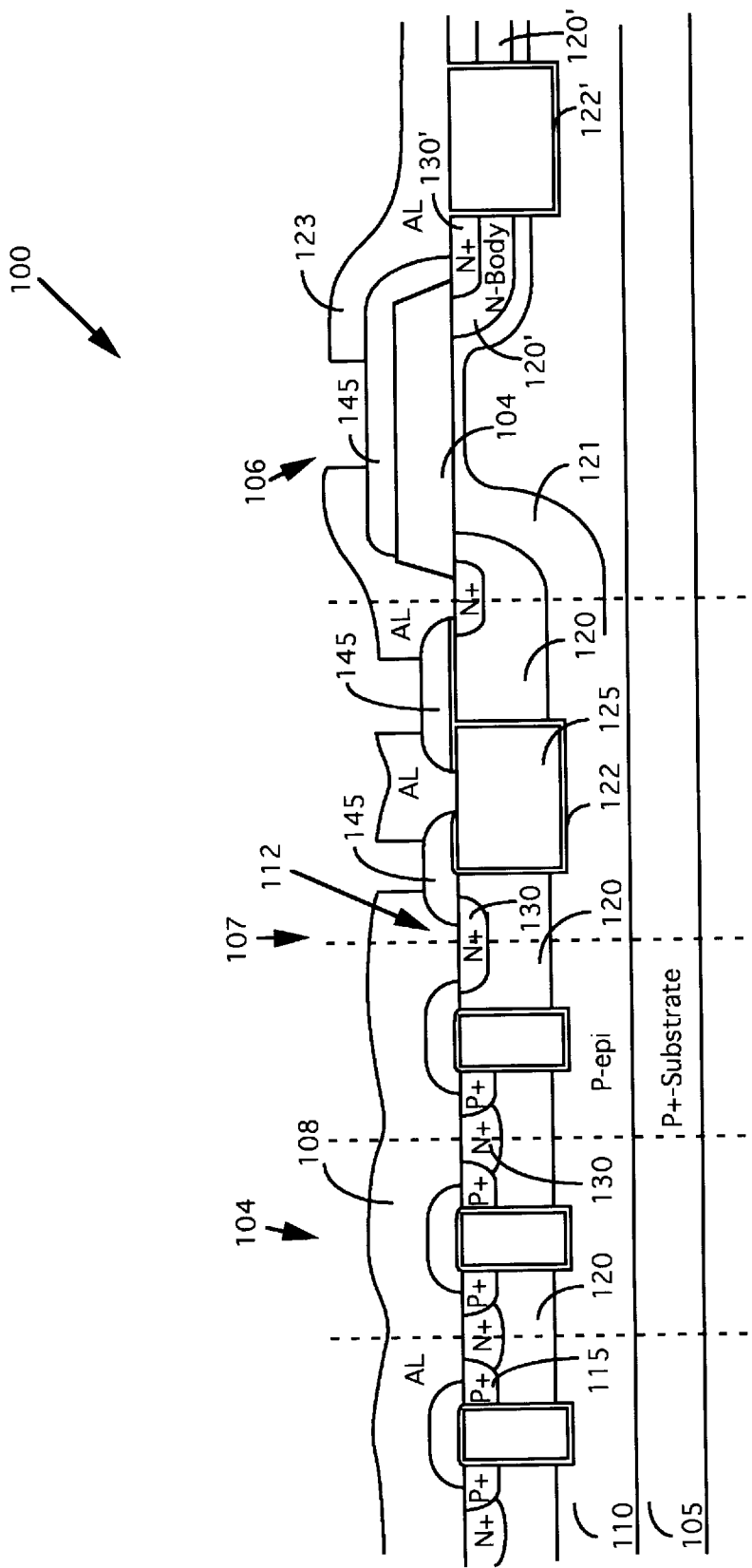

Referring to FIG. 4C, a P+ block mask 135 is applied to carry out an P+ implant to form the P+ region 115. The $P^+$ implantation is carried out with an boron ion beam at an energy of 40–100 Kev and ion flux density of $5\times10^{15}$ to $1\times10^{16}$/cm$^2$ then the resist, i.e., the $P^+$ blocking mask 135, is stripped. Referring to FIG. 4D, the $P^+$ source regions 115 are driven into desired junction depth ranging from 0.2 to 1.0$\mu$ by a diffusion process at a temperature of 900°–1000° C. for 10 minutes to two hours. A BPSG or PSG is deposited to form a layer 145 of approximately 5000–15,000 Å in thickness. A BPSG flow or BSG densification process is performed at 900°–950° C. for thirty minutes to one hour. Referring to FIG. 4D, a contact mask (not shown) is applied to perform a dry etch process to define the contacts windows in order to be ready for making source and gate contacts with a thickness of 2 to 4 $\mu$m aluminum. A blank phosphorous implant with an ion beam of 60–100 Kev and ion flux of $10^{15}$ to $1\times10^{16}$/cm$^2$ is carried out to form the n+ regions 130 for providing a low-resistance body contact of the DMOS cell. A metal deposition process is carried out to form an overlaying metal layer. The final DMOS transistor 100 is completed by applying a metal mask to pattern the source contact 150, the gate contact, the field plate and the channel stop (CS). A channel stop is formed in the termination area with a metal layer 123 overlying the specially configured termination trench 125' and the n-body 120' thus applying a drain voltage through the trenched gate 125' over a thin oxide layer 122', The depletion layer 121 carrying a channel current is stopped by the drain voltage near the bottom edges of the specially configure termination trench-gate 125', In summary, this invention also disclose a method for fabricating a trenched DMOS device 100 on a substrate 105 with specially configured termination trench for stopping a thin depletion layer carrying a leakage current near the bottom edges of the specially configured termination trench with a thin oxide lining layer. The method includes the steps of: (a) forming an epi-layer 110 of a first conductivity type as a drain region on the substrate and then growing an initial oxide layer over the epi-layer; (b) applying an active layer for etching the initial oxide layer to define an active area; (c) performing a blank body implant with impurities of a second conductivity type followed by a body-diffusion process at an elevated temperature thus forming a body layer 120; (d) applying a trench mask including a specially configured termination trench for etching the a plurality of trenches 125 in the substrate 105; and (e)removing the trench mask followed by carrying out steps to form a gate oxide layer 122 and a gate 125 in each of the trenches including the specially configure termination trench followed by the process of forming a plurality of source regions 125 and then protective and contact layers thereon whereby the specially configured termination trench functions with the gate oxide layer therein providing an effective channel stop for the trenched DMOS device.

Therefore, the present invention provides an improved trenched DMOS structure, and fabrication process to overcome the difficulties of the leakage current in the termination area as encountered in the prior art. Specifically, an improved trenched DMOS transistor is disclosed in the termination area wherein a channel stop is provided by forming a channel stop trench filled with polysilicon above a thin oxide layer thus providing an effective channel stop for a trenched DMOS transistor in the termination areas. In this improved trench DMOS structure and fabrication process, the trenched channel stop in the termination areas is formed with identical manufacture processing steps except a new trench mask is applied whereby an effective channel stop is provided without requiring changes of manufacture process or incurring any increase in production cost.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A trenched DMOS device comprising:

a substrate of a first conductivity type including a core cell area which includes at least a trenched DMOS cell having a gate disposed in a trench opened from a top surface of said substrate and a drain region disposed in said substrate, said substrate further includes a termination area which includes at least a channel-stop trench;

a source region of said first conductivity type extending from said top surface of said substrate adjacent to said trench in said substrate;

a body region of a second conductivity type of opposite polarity from said first conductivity type, said body region extends from said top surface surrounding said source region adjacent said trench in said substrate; and an insulating layer lining said trench and a conductive material filling said trench;

said channel stop trench in said termination area padded by said insulating layer with said conductive material filled therein further includes an adjacent body-doped region and a metal layer thereon for electrically connecting said channel stop trench to said adjacent body region; said metal layer shorting said channel stop trench to said drain region via said body-doped region for ternmnating a depletion channel.

2. The trenched DMOS device of claim 1 wherein:

said substrate and said source region of said first conductivity type is of a p-type conductivity and said body region of said second conductivity type is of a n-type conductivity.

3. The trenched DMOS device of claim 1 wherein:

said substrate and said source region of said first conductivity type is of a n-type conductivity and said body region of said second conductivity type is of a p-type conductivity.

4. The trenched DMOS device of claim 1 further comprising:

said conductive material filling said trenches is a polycrystalline silicon material.

5. A trenched transistor comprising:

a substrate of a first conductivity type including a core cell area which includes at least a cell having a gate disposed in a trench and a drain region disposed in said substrate, said substrate further includes a termination area includes at least a channel-stop trench;

an insulating layer lining said trenches and a conductive material filling said trench;

said channel stop trench in said termination area padded by said insulating layer with said conductive material filled therein further includes an adjacent body-doped region and a metal layer thereon for electrically connecting said channel stop trench to said adjacent body region; said metal layer shortening said channel stop trench to said drain region via said body-doped region for terminating a depletion channel.

6. The trenched transistor of claim 5 wherein:

said conductive material filling said trenches is a polycrystalline silicon material.

7. The trenched transistor of claim 5 wherein:

said cell includes a source region of said first conductivity type extending from said top surface of said substrate adjacent to said trenches in said substrate; and said trenched transistor cell further includes a body region of a second conductivity type of opposite polarity from said first conductivity type, said body region extends from a top surface of said substrate surrounding said source region adjacent to said trenches in said substrate.

8. The trenched transistor of claim 7 wherein:

said substrate and said source region of said first conductivity type is of a p-type conductivity and said body region of said second conductivity type is of a n-type conductivity.

9. The trenched transistor device of claim 7 wherein:

said substrate and said source region of said first conductivity type is of a n-type conductivity and said body region of said second conductivity type is of a p-type conductivity.

* * * * *